United States Patent
Harle et al.

(10) Patent No.: US 7,106,090 B2
(45) Date of Patent: Sep. 12, 2006

(54) OPTICAL SEMICONDUCTOR DEVICE WITH MULTIPLE QUANTUM WELL STRUCTURE

(75) Inventors: Volker Harle, Laaber (DE); Berthold Hahn, Hermau (DE); Hans-Jurgen Lugauer, Sinzing (DE); Helmut Bolay, Pettendorf (DE); Stefan Bader, Eilsbrunn (DE); Dominik Eisert, Regenburg (DE); Uwe Strauss, Bad Abbach (DE); Johannes Volkl, Erlangen (DE); Ulrich Zehnder, Regensburg (DE); Alfred Lell, Maxhutte-Haidhof (DE); Andreas Weimer, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/014,677

(22) Filed: Dec. 16, 2004

(65) Prior Publication Data

US 2005/0116216 A1   Jun. 2, 2005

Related U.S. Application Data

(63) Continuation of application No. 09/913,394, filed as application No. PCT/DE00/04089 on Feb. 5, 2002, now Pat. No. 6,849,881.

(30) Foreign Application Priority Data

Nov. 19, 1999 (DE) ............................... 199 55 747
Nov. 20, 2000 (WO) ..................... PCT/DE00/04089

(51) Int. Cl.
  *G01R 31/00* (2006.01)
  *G01R 31/26* (2006.01)
  *G01R 31/28* (2006.01)

(52) U.S. Cl. ..................................... 324/770; 324/766

(58) Field of Classification Search ............... None
See application file for complete search history.

(56) References Cited

U.S. PATENT DOCUMENTS

| 5,684,309 A | 11/1997 | McIntosh et al. |
| 5,831,277 A | 11/1998 | Razeghi |
| 5,851,905 A | 12/1998 | McIntosh et al. |
| 5,875,052 A | 2/1999 | Shmagin et al. |

(Continued)

FOREIGN PATENT DOCUMENTS

DE            19648955           5/1997

(Continued)

OTHER PUBLICATIONS

S.D. Lester et al., "High-efficiency inGaN MQW blue and green LEDs", *Journal of Crystal Growth*, 189/190 (1998), pp. 786-789, Elsevier Science B.V.

(Continued)

Primary Examiner—Jermele Hollington
Assistant Examiner—Trung Q. Nguyen
(74) Attorney, Agent, or Firm—Fish & Richardson P.C.

(57) ABSTRACT

An optical semiconductor device with a multiple quantum well structure, in which well layers and barrier layers comprising various types of semiconductor layers are alternately layered, in which device well layers (6a) of a first composition based on a nitride semiconductor material with a first electron energy and barrier layers (6b) of a second composition of a nitride semiconductor material with electron energy which is higher in comparison with the first electron energy are provided, followed, seen in the direction of growth, by a radiation-active quantum well layer (6c), for which the essentially non-radiating well layers (6a) and the barrier layers (6b) arranged in front form a superlattice.

19 Claims, 3 Drawing Sheets

U.S. PATENT DOCUMENTS

| | | | |
|---|---|---|---|
| 6,023,077 A | 2/2000 | Iyechika et al. | |
| 6,198,112 B1 | 3/2001 | Ishida et al. | |
| 6,252,894 B1 * | 6/2001 | Sasanuma et al. | 372/45.01 |
| 6,377,597 B1 | 4/2002 | Okumura | |
| 6,449,299 B1 | 9/2002 | Sato | |
| 6,614,059 B1 | 9/2003 | Tsujimura et al. | |
| 6,849,881 B1 * | 2/2005 | Harle et al. | 257/191 |
| 2002/0085603 A1 | 7/2002 | Okumura | |

FOREIGN PATENT DOCUMENTS

| | | |
|---|---|---|
| EP | 0666624 B1 | 2/1995 |
| EP | 0731510 A2 | 9/1996 |
| EP | 0833395 A2 | 9/1997 |
| EP | 09080988 A2 | 4/1999 |
| EP | 1017113 A1 | 7/2000 |
| JP | 10-242512 | 9/1998 |

OTHER PUBLICATIONS

Sergey Yu. Karpov et al., "A Quantitative Model of Surface . . . ", *Materials Research Society,* vol. 618, 2000 pp. 185-191.

Jean-Michel Gérard, "Growth of InGaAs/GaAs heterostructures with abrupt interfaces on the monlayer scale", Journal of Crystal Growth, vol. 150, 1995, pp. 467-472.

\* cited by examiner

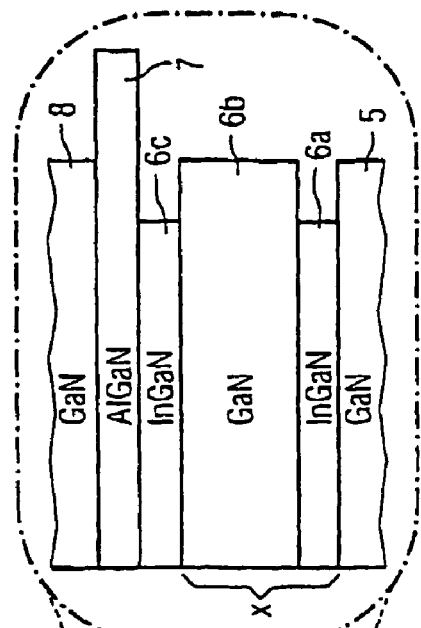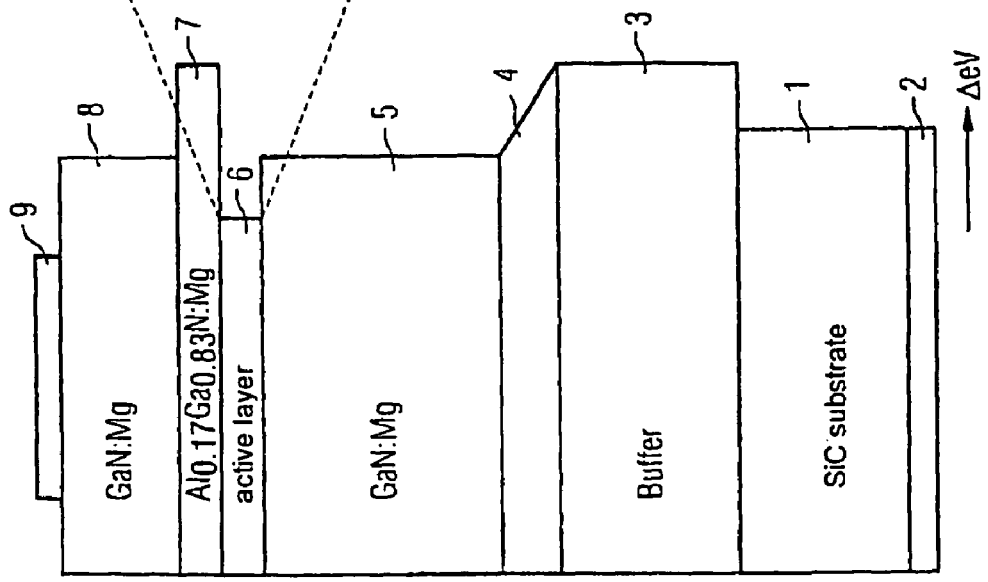

OPTICAL SEMICONDUCTOR DEVICE WITH MULTIPLE QUANTUM WELL STRUCTURE

CROSS REFERENCE TO RELATED APPLICATIONS

Pursuant to 35 U.S.C. § 120, this application continued claims the benefit of prior U.S. application Ser. No. 09/913,394, filed Feb. 5, 2002 U.S. Pat. No. 6,849,881 which is a National Phase Application for International Application No. PCT/DE00/04089, filed Nov. 20, 2000, which claims priority to German patent application 19955747.0, filed Nov. 19, 1999.

FIELD OF THE INVENTION

The invention relates to an optical semiconductor device with a multiple quantum well structure, in which well layers and barrier layers comprising various types of semiconductor layers are alternately layered.

BACKGROUND OF THE INVENTION

A device of this type is known for example from EP 0 666 624 B1 or from Journal of Crystal Growth 189/190 (1998) pages 786–789.

The high quantum efficiency of indium-gallium-nitride (InGaN)-based LEDs and laser diodes is caused by the self-organized growth of indium-rich islands in the active quantum well. As a result, the injected charge carriers are spatially localized at these islands and are prevented from non-radiating recombination at lattice defects.

The nucleation of these quantum dots must be initiated by suitable buffer layers. In particular, indium-containing structures are suitable before the actual active zone as a buffer layer. Indium-containing nitridic semiconductors ($Ga_x Al_y In_{1-(x+y)}N$ semiconductors) have a tendency toward segregation and formation of indium-containing phases. This leads to varying strain fields at the growth surface, promoting the formation of indium-rich islands in the active quantum well. GaInN layers approximately 100 nm thick can be deposited before the active zone in order to improve the GaInN quantum dot nucleation.

Previously, an optimum efficiency could be achieved with, for example, 2- to 10-fold quantum well structures. As can be shown experimentally, the emitted photons are generated exclusively in the two uppermost quantum wells (i.e. those closest to the p side). A suitable choice of growth parameters achieves the effect that the emission takes place exclusively in the uppermost of the quantum wells. The lower quantum wells serve for improving the nucleation of the GaInN islands in the uppermost quantum well. Dispensing with them causes the optical output power to be reduced by over 50%. However, these quantum wells lead to a considerable increase in the forward voltage. The forward voltage can be improved by reducing the number of wells at the expense of the quantum efficiency. The piezo fields, which lead to the observed increase in the forward voltage, can be compensated by high doping levels in the quantum well region. However, this adversely effects the crystal quality of the active layer or impairs the injection behavior and consequently reduces the internal quantum efficiency.

BRIEF SUMMARY OF THE INVENTION

The invention is based on the object of improving in this respect an optical semiconductor device of the type stated at the beginning.

The invention provides a multiple quantum well structure with well layers and barrier layers comprising various types of semiconductor layers which are layered alternately one on top of the other, in which the well layers are thin layers of a first composition based on a nitride semiconductor material with a first electron energy and the barrier layers are layers which are thicker in comparison, of a second composition of a nitride semiconductor material with electron energy which is higher in comparison with the first electron energy. Acting as the radiation-active quantum well, seen in the direction of growth, is firstly one of the last quantum well layers or the last quantum well layer. The well layers arranged in front, which essentially do not radiate, and the barrier layers form a superlattice for this last layer.

In a particularly preferred development, in the superlattice, the well layers are thin aluminum-gallium-indium-nitride layers and the barrier layers are gallium-nitride layers which are thicker in comparison and the active quantum well has indium-gallium-nitride.

Within at least one well layer of the superlattice, the In content preferably increases in the direction of growth, i.e. in the direction of the radiation-active quantum well layer. At the same time, the indium content remote from the radiation-active quantum well layer is preferably below 5%.

In a particularly preferred development, at least one of the well layers of the superlattice has at least one pair of single layers, of which the first single layer in the direction of growth has a lower indium content than the second single layer in the direction of growth. This well layer preferably has a plurality of single layers whose indium content increases step by step from the single layer lying furthest away from the radiation-active quantum well layer to the single layer lying closest to the radiation-active quantum well layer. It is particularly preferred for the steps of the increase in indium content to be smaller than 5%. It is also particularly preferred for the indium content of the single layer furthest away from the radiation-active quantum well layer to be less than 5%. The thickness of the single layers preferably lies in the range of just a few monolayers, particularly preferably approximately one monolayer.

The particular advantage of the step-by-step increase in the In content is that a potential profile resembling a delta potential is produced, in particular in the case where the thickness of the single layers does not significantly exceed that of a monolayer. The difference in the energy level in the barrier layers and the energy level obtained for one electron in the well layer is consequently not greater than in the case of a rectangular well layer with a significantly lower indium content as the uppermost single layer of the stepped well layer. This achieves the effect that the advantages of a reduced overall indium content are retained, but the strain is at the same time influenced by the high indium content of the last single layer in such a way that the nucleation of InGaN-rich phases is improved and, consequently, the quantum efficiency is increased.

A further advantage arises for the following reason: the epitaxial growth of indium-containing III-V semiconductors (for example InGaAs, InGaN) is made more difficult by the relatively great atom radius of the indium. With constant fluxes of the group III components, indium is therefore incorporated with a delay. The indium concentration increases during the growth and approaches an equilibrium value exponentially. During the enriching phase, a certain indium coverage is formed on the growth surface. Only when this coverage is achieved is a constant amount of indium incorporated into the crystal. If, however, too much indium is offered, the indium present on the surface forms metallic droplets, which reduce the quality of the deposited layers. In particular, however, such indium droplets produce shunts at the p-n junction, reducing not only the quantum efficiency but also the stability with respect to electrostatic discharging (ESD). These effects are reduced by initially depositing indium-containing layers with a low indium content, preferably less than 5%, then increasing the indium content in subsequent layers. In the case of the active layer itself, the substructure is then already prepared by the well layers in such a way that InGaN compositions with a higher indium content can be deposited.

The nucleation of indium-rich phases is advantageously improved by the increasing indium content in the well layer or layers. The harmful formation of indium droplets is at least considerably reduced.

Further advantageous developments and refinements of the invention are the subject of subclaims.

BRIEF DESCRIPTION OF THE DRAWINGS

The invention is explained in more detail below on the basis of an exemplary embodiment with the aid of the figures, in which:

FIG. 1a, b shows a schematic representation of the layer structure of a device according to the invention.

DETAILED DESCRIPTION OF THE INVENTION

Figure 2:
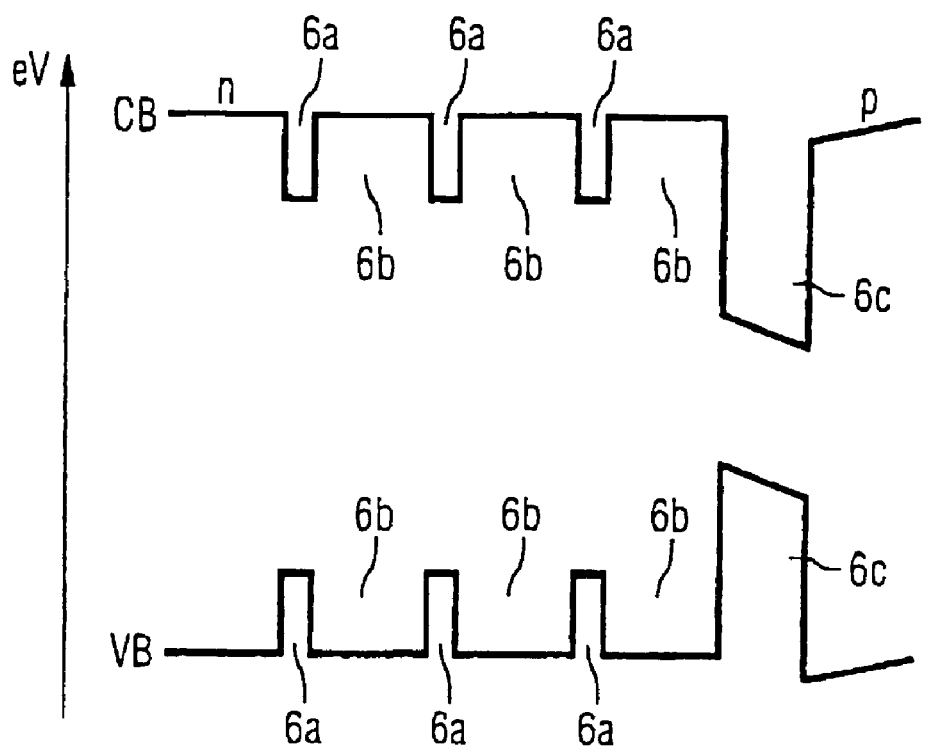
FIG. 2 shows a schematic representation of the quantum well structure of the device according to FIG. 1.

According to FIG. 1a, initially a buffer layer 3 of aluminum-gallium-nitride (AlGaN) is formed on a substrate 1 of silicon carbide (SiC), to which a first contact electrode 2 is connected. This is followed by a further layer 4 of aluminum-gallium-nitride. A further buffer layer 5 of silicon-doped gallium nitride is arranged over the layer 4 and the quantum well structure 6a, b, still to be explained in more detail, is arranged over that, followed by the actual active layer 6c. Arranged over the active layer 6 is a further layer 7 of aluminum-gallium-nitride, which serves as an electron barrier. This layer 7 is preferably doped with magnesium. A further GaN layer, not designated, may be arranged between the layers 6 and 7. A gallium-nitride layer 8, on which a second contact electrode 9 of the device is provided, is arranged over the layer 7.

The right-hand side of the layer structure shows in a schematically indicated manner the band gap of the single layers between the valence band and the conduction band.

The buffer layer 3 functionally serves as a growth layer, which is required to allow the LED structure to grow on the silicon carbide substrate 1. The further aluminum-gallium-nitride layer 4 between the layers 3 and 5 has an aluminum content which changes in the direction of the gallium-nitride layer 5. The gallium-nitride layer 5 is preferably silicon-doped. The layer 7 of magnesium-doped aluminum-gallium-nitride arranged over the active layer 6 serves as an electron barrier.

This basic structure of FIG. 1a can be used as standard for gallium-aluminum-indium-nitride light-emitting diodes (LEDs).

FIG. 1b is an enlarged representation of the active layer 6 according to the invention. The layer with the quantum well structure 6 is constructed by layers 6a of gallium-indium-nitride (GaInN) being arranged between individual gallium-nitride (GaN) layers 6b. The actually active, i.e. light-emitting, layer 6c of gallium-indium-nitride (GaInN) is followed by the uppermost gallium-nitride layer 6b.

As can be seen, layers 6a and 6b of different thickness alternate. The thinner layers 6a of indium-gallium-nitride and the thicker layers 6b of gallium-nitride in this case form superlattices, in which the wells 6a are thin, i.e. thinner than 3 nm, and the layers 6b are 3 nm and above. The layers are produced by vapor-phase or molecular-beam epitaxy. In this case, a slow growth of 1–10 nm/min, preferably 1–2 nm/min, at low temperatures around 700° C. is intended.

The indium content lies below 24%, preferably however below 20%, and is therefore preferably reduced in comparison with customary indium contents. The layers 6a and 6b, depicted only once in the figure, may be arranged repeatedly one above the other, the structure preferably being repeated x=3 times. The uppermost gallium-nitride layer 6b is followed by the actually active, i.e. illuminating, layer 6c of indium-gallium-nitride.

It may preferably be envisaged to dope the quantum well structure 6a, 6b with silicon in a concentration of $10^{17}$ to $10^{18}$ cm$^{-3}$. This once again provides a significant improvement in comparison with an undoped structure.

FIG. 2 shows the energy conditions for the valence band VB and the conduction band CB. The electron energy is plotted in the direction of the y-axis, the quantum wells with a width corresponding to the layer thickness are plotted in the direction of the x-axis. The uppermost gallium-nitride layer 6b is followed by the actually active layer 6c.

Figure 3:
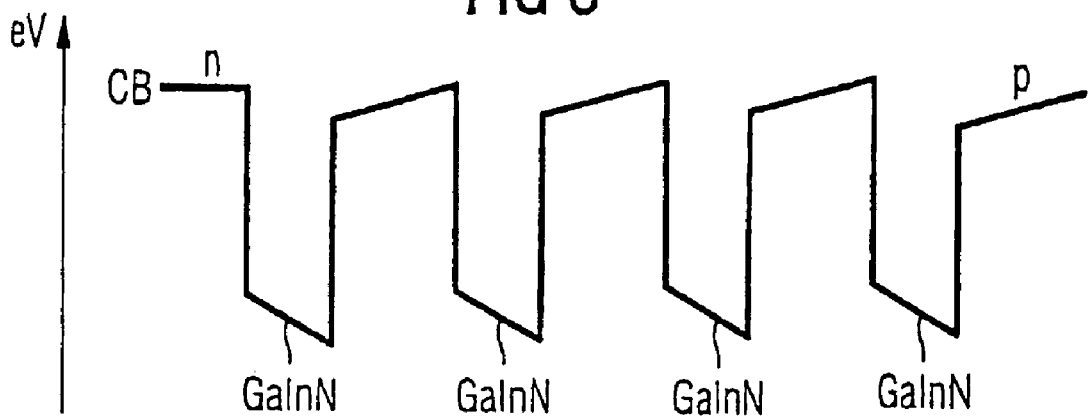
FIG. 3 shows a schematic representation of the quantum well structure of a customary type.

FIG. 3 shows by comparison the valence band with thicker quantum wells of gallium-indium-nitride than in the case of the invention. The effect of the piezoelectric fields produced by the strains is indicated by the sloping lines.

The use according to the invention of GaInN/GaN superlattices with thin wells (to a quantum well width of approximately 2 nm) in a layer structure according to FIG. 1 and with quantum well conditions according to FIG. 2 allows the forward voltage to be significantly lowered and, at the same time, the high internal quantum efficiency of the indium-gallium-nitride-based optical semiconductor device to be maintained. The piezo fields otherwise forming are avoided entirely or have virtually no effect any longer. In comparison with customary single quantum-well structures, in which no gallium-indium-nitride superlattice is deposited before the active well, the device structure according to the invention has twice the conversion efficiency.

Superlattices are understood as meaning generally a particularly periodic sequence of layers only a few atomic layers thick. The superlattice is separated from the active well by a GaN or AlGaN barrier (>3 nm). The silicon doping of the quantum well structure is significantly improved in comparison with the undoped structure.

In comparison with known superlattice structures, the device structure according to the invention has a forward voltage that is lowered by >0.5 V.

In comparison with SQW (Single Quantum Well) structures, in which no GaInN superlattice is deposited before its active quantum well, it has been possible to double the conversion efficiency.

The combination of thin, and low-indium-content, optically inactive quantum wells ("pre-wells") with an active quantum well 6c allows the emission behavior of the previously known multiple quantum well structures to be maintained and the forward voltage to be lowered. The thin GaInN quantum wells improve the quality of the active quantum well, while the low layer thickness of the "prewells" and their low indium content have the effect of reducing the formation of disturbing piezo fields. The forward voltage is therefore not increased by this nucleation layer in comparison with a SQW structure.

Figure 4:
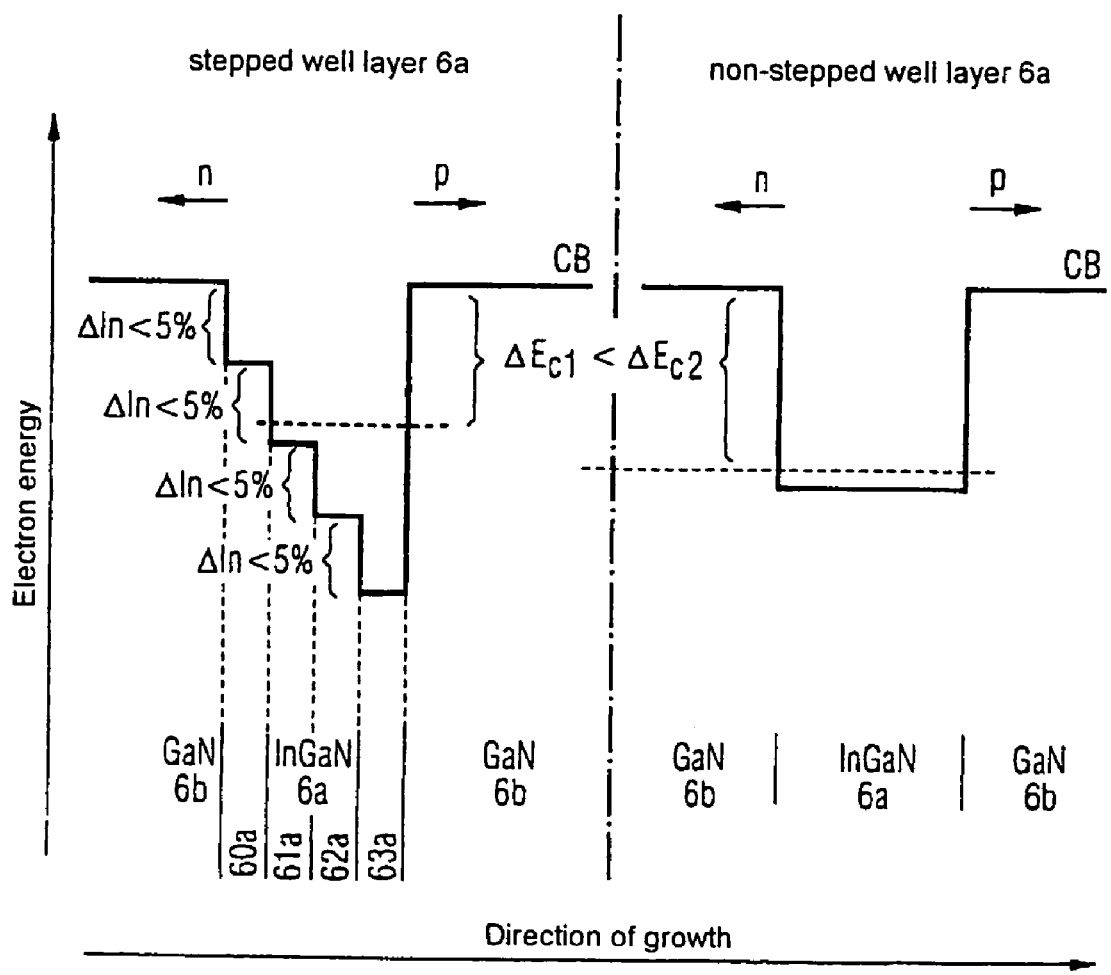
FIG. 4 shows a schematic representation of the profile of the conduction band according to a particularly preferred embodiment of the invention.

FIG. 4 shows the profile of the conduction band in an InGaN well layer 6a between two GaN barrier layers, the GaN barrier layer 6a comprising a total of 4 single layers 60a to 63a. The indium content increases step by step from the single layer 60a lying furthest away from the radiation-active quantum well layer 6c to the single layer 63a lying closest to the radiation-active quantum well layer 6c. The steps of the increase in the indium content are smaller than 5% and the indium content of the single layer 60a lying furthest away from the radiation-active quantum well layer 6c is less than 5%. The layer thickness of each of the single layers 60a to 63a lies in the range of just a few monolayers or corresponds approximately to one monolayer of the composition.

This produces a potential profile which is similar to a delta potential. Consequently, the difference between the energy level in the barrier layers and the energy level obtained for an electron in the stepped well layer is no greater than in the case of a rectangular well layer (represented on the right-hand side in the figure) with a much lower indium content than the uppermost single layer of the stepped well layer. This achieves the effect that the advantages of a reduced overall indium content are maintained, but at the same time the strain is influenced by the high indium content of the last single layer in such a way that the nucleation of InGaN-rich phases is improved, and consequently the quantum efficiency is increased.

The description of the invention on the basis of the above exemplary embodiment is of course not to be understood as a restriction of the invention to this embodiment. Rather, the invention also relates to devices in other material systems in which similar problems are to be solved.

What is claimed is:

1. An optical semiconductor device comprising
    a multiple quantum well structure the multiple quantum well structure comprises:
    at least one combination of alternating essentially non-radiating well layers and barrier layers, both comprising various semiconductor layers based on a nitride semiconductor material; and
    a radiation-active quantum well layer, disposed over the essentially non-radiating well layers and barrier layers.

2. The optical semiconductor device according to claim 1, wherein the well layers comprise thin aluminum-indium-gallium-nitride layers and the barrier layers comprise gallium-nitride or aluminum-gallium-nitride layers which are thicker than the well layers and the radiation-active quantum well comprises an indium-gallium-nitride layer.

3. The optical semiconductor device according to claim 2, wherein the well layers and barrier layers are doped with silicon.

4. The optical semiconductor device according to claim 3, wherein the dopant concentration is from $10^{17}$ to $10^{18}$ cm$^{-3}$.

5. The optical semiconductor device according to claim 1, wherein the radiation-active quantum well follows an uppermost barrier layer.

6. The optical semiconductor device according to claim 1, wherein layer thickness of the radiation-active quantum well is greater than layer thickness of the essentially non-radiating well layers.

7. The optical semiconductor device according to claim 1, wherein the essentially non-radiating well layers are thinner than 2 nm and the barrier layers are at least 3 nm thick.

8. The optical semiconductor device according to claim 1, wherein within at least one of the essentially non-radiating well layers and indium content increases in a direction of growth.

9. The optical semiconductor device according to claim 8, wherein in the essentially non-radiating well layers the indium content, remote from the quantum well layer, lies below 5%.

10. An optical semiconductor device comprising
    with a multiple quantum well structure the multiple quantum well structure comprises:
    at least one combination of alternating well layers and baffler layers, both comprising various semiconductor layers based on a nitride semiconductor material, wherein at least one of the well layers is configured to produce a stepped potential profile.

11. The optical semiconductor device according to claim 10, wherein the at least one of the well layers has at least one pair of single layers, of which a first of the at least one pair, in a direction of growth, has a lower indium content than a second of the at least one pair in a direction of growth.

12. The optical semiconductor device according to claim 11, wherein the second of the at least one pair has an increased indium content of less than 5% than the first of the at least one pair.

13. The optical semiconductor device according to claim 11, wherein the indium content of the first of the at least one pair of single layers is less than 5%.

14. The optical semiconductor device according to claim 11, wherein the at least one well layer comprises a plurality of single layers whose indium content increases in direction of growth.

15. The optical semiconductor device according to claim 14, wherein the indium content increase is smaller than 5%.

16. The optical semiconductor device according to claim 14, wherein the thickness of each of the plurality of single layers comprises at least one monolayer.

17. The optical semiconductor device according to claim 10, wherein the well layers are essentially non-radiating well layers.

18. The optical semiconductor device according to claim 10, wherein a radiation-active quantum well layer is disposed over the well layers and barrier layers.

19. The optical semiconductor device according to claim 10, wherein the stepped potential profile is similar to a delta potential.

* * * * *

UNITED STATES PATENT AND TRADEMARK OFFICE
CERTIFICATE OF CORRECTION

PATENT NO. : 7,106,090 B2
APPLICATION NO. : 11/014677
DATED : September 12, 2006
INVENTOR(S) : Volker Härle et al.

It is certified that error appears in the above-identified patent and that said Letters Patent is hereby corrected as shown below:

Column 6
Line 13, delete "and", insert -- an --

Column 6,
Line 23, delete "baffler", insert -- barrier --

Signed and Sealed this

Nineteenth Day of December, 2006

JON W. DUDAS
*Director of the United States Patent and Trademark Office*